United States Patent [19]

Nambu et al.

[11] Patent Number: 5,071,602
[45] Date of Patent: Dec. 10, 1991

[54] METHOD OF MAKING PHANTOM FOR NMR DIAGNOSIS

[75] Inventors: Masao Nambu; Kazue Saitoh, both of Yokohama, Japan

[73] Assignee: Nippon Oil Co., Ltd., Tokyo, Japan

[21] Appl. No.: 563,824

[22] Filed: Aug. 1, 1990

Related U.S. Application Data

[63] Continuation of Ser. No. 235,669, Aug. 24, 1988, abandoned.

[30] Foreign Application Priority Data

Aug. 27, 1987 [JP] Japan .................. 62-211392

[51] Int. Cl.⁵ .................. B29C 39/02; G01V 3/14
[52] U.S. Cl. .................. 264/28; 128/653.5; 264/251; 264/254; 264/255; 264/299; 264/348; 324/307; 324/321
[58] Field of Search .......... 436/173; 324/308, 309, 324/318, 321, 307; 128/653 SC; 264/28, 251, 254, 299, 255, 348, 331.15

[56] References Cited

U.S. PATENT DOCUMENTS

| | | | |
|---|---|---|---|
| 4,323,782 | 4/1982 | Riihimaki et al. | 250/252.1 |
| 4,551,678 | 11/1985 | Morgan et al. | 324/321 |
| 4,625,168 | 11/1986 | Meyer et al. | 324/318 |
| 4,692,704 | 9/1987 | Gray | 324/318 |
| 4,719,406 | 1/1988 | Schaefer et al. | 324/318 |
| 4,729,892 | 3/1988 | Beall | 436/173 |
| 4,774,957 | 10/1988 | Nambu et al. | 264/28 |
| 4,777,442 | 10/1988 | Rosenthal | 324/318 |
| 4,804,529 | 2/1989 | Bardy et al. | 436/173 |

Primary Examiner—Jeffery Thurlow
Assistant Examiner—Mathieu Vargot
Attorney, Agent, or Firm—Darby & Darby

[57] ABSTRACT

A method of making a phantom for NMR diagnosis contains the steps of placing at least one small container having at least a portion of its wall made of a thin film of a plastic material in a large container made of a plastic material, charging a first aqueous solution of polyvinyl alcohol into the small container, charging a second aqueous solution of polyvinyl alcohol into a space defined by the outer wall of the small container and the inner wall of the large container, freezing the first and second aqueous solutions of polyvinyl alcohol to obtain frozen masses, and then thawing the frozen masses. A composition of the first aqueous solution of polyvinyl alcohol is different from a composition of the second aqueous solution of polyvinyl alcohol.

17 Claims, 1 Drawing Sheet

METHOD OF MAKING PHANTOM FOR NMR DIAGNOSIS

This is a continuation of application Ser. No. 07/235,669, filed Aug. 24, 1988, now abandoned.

BACKGROUND OF THE INVENTION

The present invention relates to a method of making a model equivalent to living tissue, such as a simulating image, phantom or reference material, which is required in maintenance, inspection, servicing, adjustment and appraisal of a system used for diagnosis by nuclear magnetic resonance (NMR) imaging and which is also required in analysis and study of the images obtained by the NMR diagnosis. More particularly, the present invention relates to a method of making a phantom for NMR diagnosis, the phantom being adapted for the inspection of the discrimination ability of the system, namely the ability of the system for detecting the difference in water contents, spin-lattice relaxation time and spin-spin relaxation time between different samples.

The method for the diagnosis of an internal site of a living body, for instance, to have an information concerning a certain lesion site or a condition of blood stream, is generally referred to as the NMR imaging method, the NMR tomographical diagnosis method, MRI (magnetic resonance imaging) method, the MMR (medical magnetic resonance) method, the MNI (multi-nuclear imaging) method, and the NMR-CT (computerized or computer assisted tomography) method. In such a method, a living body is placed in a static magnetic field and a radio-frequency wave having a high frequency corresponding to the resonance wave length is applied so that the atomic nuclei of hydrogen or proton in the living tissue are excited, and then the magnetic informations generated from the thus excited atomic nuclei are detected as the output signals to form an image by such output informations. Such an image includes the nuclear magnetic informations concerning the concentration of protons contained in the living tissue (which gives an information concerning the water content in the living tissue), those concerning the spin-lattice (longitudinal) relaxation time ($T_1$) and those concerning the spin-spin (transverse) relaxation time ($T_2$). By analyzing the image, the condition of the lesion site may be discriminated, and the distribution of blood stream velocity in the living tissue may be imaged. The NMR imaging method is expected as a novel tool for the early stage diagnosis of a variety of diseases, since it is superior over or overcoming the demerits of the known X-ray tomography, DSA (digital substraction angiography), PET or PE-CT (positron emission tomography) and US (ultrasonic method) for the reasons that any desired cross section of a living tissue can be imaged without trespassing internally of the living tissue, without being disturbed by the bones or air in the respiratory organs, and without any apprehension of exposure by a radioactive isotope or X-ray (In this connection, reference should be made to C. L. Partain et al., "Nuclear Magnetic Resonance Imaging" (1983), W. B. Sanders Co.). However, the conventional system used for the NMR diagnosis is inferior in operational stability when compared with the stabilities of the systems used for the X-ray-CT and PE-CT methods In practice of the NMR imaging, the system used therefor must always be paid with continuous care as to its maintenance, inspection, servicing, adjustment and appraisal of the performance characteristics.

In general, the device for reading out an information and the display device incorporated in the NMR system used for the chemical analysis are computerized, and it has been pointed out that "there is a grave tendency that exceedingly many chemists apt to accept the displayed data as accurate analytical results without taking what has been done in the system into account." In the NMR system for diagnosis, the control system, the manual for operations and the mode of imaging have not yet been standardized, often leading to difficulty in study and analysis of the image. Under such circumstances, certain erroneous diagnoses have been specifically pointed out and there is earnest demand for the search and establishment of a standard probe used for inspecting the operational condition of the system (E. L. Madsen, "Mag. Res. Imag.", 1, 135 (1982)).

The performance characteristics of NMR systems are significantly affected by the maintenance, control and adjustment operations. In addition, influences by magnetic materials, such as steel or iron used to construct a building in which the NMR system is housed, must be amended by the provision of a symmetrical coil. It is further necessary to adjust the frequency and to adjust the static magnetic field by amending or compensating the influences due to magnetic field established by radio frequency waves or plate-shape magnetic wave sources. However, significant difficulties are encountered in such adjustment or amendment operations. Furthermore, since the system cannot be assembled precisely in accordance with the theory and design thereof, similarly to general precise mechanical instruments, there is frequently pointed out the uneven orientation of the static magnetic field in the transverse direction, and it is hard to perfectly amend such uneven orientation of the magnetic field. Although it is convenient from the economical standpoint of view to lessen the magnetic field in order to improve the uniformity of the static magnetic field, it is meaningless to provide an NMR system for handling a small sample or test specimen when the system is to be used for the diagnosis of a human body. It should also be appreciated that a large scale magnet used for the diagnosis of a human body is accompanied with various imperfections which are not corrected or amended to give satisfactory data since any standard therefor has not yet been established at the present day (See D. J. Hoult, "Rev. Sci. Instrum.", 56 (1) 131 (1985) and R. T. Droege et al., "Radiology", 148, 763 (1983).).

In the meantime, the operation of the system also involves many problems which should be born in mind of the operator or the analyst. For example, the level of the radio frequency wave and the pulse interval should be properly selected, and the scanning speed should be pertinently set not to reduce the resolution power of the system, depending on the conditions of the disease. Furthermore, the NMR signals depend on the specific type of the system used, particularly on the intensity of the static magnetic field in the system, and the conversion factor between different systems cannot be determined monistically, as reported by I. Young, "Electronics & Power", 1984, March, 205. Moreover, even when the same system is used, the $T_1$ and $T_2$ (image signals) vary in response to the pulse interval ($T_r$), the delay time ($T_d$) and the echo time ($T_e$). However, the photographing condition for imaging cannot be set monistically to a certain condition. In detail, the difference (i.e. the contrast between the image of normal tissue and that of diseased site) in the NMR signal induced by the change due to a morbid state is to be discriminated by the NMR diagnosis. However, since more than an hour is expended for individual imaging by calculation of the NMR signals (proton density $\rho$, $T_1$ and $T_2$) and since special value cannot always be expected by such individual imaging, it is a common practice to form an image including all of the above factors as prompt measure. In such a case, rather than taking the aforementioned three factors equally into account, endeavor is directed to the establishment of an image having clear contrast so as to have the maximum discrimination ability for discriminating the lesion site by imaging the respective factors through the non-uniformly weighed addition (while adopting the trial-and-error method) in response to the condition of disease, the personal difference and the conditions of the surrounding tissues around the lesion site (In this connection, reference should be made to G. Hansen et al., "Radiology", 136, 695 (1980) and I. E. Crooks, "I.E.E.E. Trans. Nucl. Sci.", NS-27, 1239 (1980)). For these reasons, unitary display of the NMR signals is sacrificed to result inevitably in devoid of interchangeability between the images to induce problems in analysis of the images, as reported by T. Araki et al., "Radiology", 150, 95 (1984).

In consideration of the aforementioned status quo of the NMR imaging technology, it is a natural demand for a reference or control specimen for the objective appraisal, judgement on the maintenance, control, adjustment, operational condition and performance condition and for the analysis of the displayed images. Examples of the materials proposed as those which may be used for the preparation of a reference specimen in the NMR imaging method, include tetramethylsilane, hexamethyldisiloxane, hexamethyldisilane, neopentane, DSS (sodium 2,2-dimethyl-2-silapentano-5-sulfonate) and sodium 2,3-tetradeuterium-3-trimethylsilylpropionate. Although these materials are conveniently used in the chemical analysis as the materials for preparing reference specimens used to measure the chemical shifts of the NMR informations, they are not suited for use as the material for the reference specimen used to provide basic informations or factors (proton density $\rho$, $T_1$ and $T_2$) in the NMR diagnosis, at all.

In some cases, poly(methyl methacrylate) and a low density polyethylene have been used in an NMR system for the adjustment purpose. However, the poly(methyl methacrylate) is used merely for the inspection of the peak width of the chemical shift during the chemical analysis, and the low density polyethylene is used only for the adjustment of the level of radio frequency wave. Neither materials have utility as the reference materials used for the adjustment operation when the system is used for obtaining NMR informations concerning a living body.

It has been proposed to use water, an aqueous solution of manganese sulfate, nickel chloride or copper sulfate or sulfuric acid, as the standard for inspection and adjustment of the system, since the NMR diagnosis is applied for the diagnosis of a substance (i.e. a living tissue) containing a large quantity of water. However, water is improper for a standard material used in the NMR analysis, since $T_1$ and $T_2$ of water are seriously affected by temperature and are also affected by dissolved oxygen. On the other hand, it is extremely difficult to prepare a solution simulating NMR informations of a living tissue (water content. $T_1$ and $T_2$) by the use of any of the aforementioned solutions.

There are known in the art a variety of solids or gels containing water and having structures resembling the living tissues, the examples being gelatin, agar, polyacrylamide, carrageenan, agarose, jam, boiled egg, KONNYAKU (devil's tongue), alginic acid gel and bean-curd. However, a material having a water content agreed with those of the internal organs of a living body (namely, having a water content of from about 70 to 85 wt %) and having the $T_1$ and $T_2$ values agreed with those of the internal organs of a living body has not yet been known (In this connection, reference should be made to O. Hechter et al., "Proc. Natl. Acad. Sci.", 46, 783 (1960); C. Sterling et al., "Makromol. Chem.", 116, 140 (1968); D. E. Woessner et al., "J. Colloid. Interface Sci.", 34, 283, 290 (1970); W. Derbyshire et al., "Disc. Farad. Soc.", 1974, 243; C. J. G. Bakkert et al., "Phys. Med. Biol.", 29, 1511 (1984); and R. M. Vre et al., "Mag. Res. Med.", 2, 176 (1985)). Although continuous attempts are made to improve the process for the preparation of these hydrogels so as to bring the NMR signals ($\rho$, $T_1$ and $T_2$) thereof close to those of living tissues by admixing some quantity of impurities, such attempts have not succeeded as will be described hereinbelow. For instance, even gelatin containing water considerably less than that of the living body has disadvantageously high $T_1$ and $T_2$ values. Although an approach for improving the properties of gelatin had been continued, such an approach produced no valuable fruit, since there appeared uneven gelation during the step of cross-linking and solidifying the gelatin. Anyway, it is not possible to bring the three factors, i.e. the water content (ranging within 70 to 85%), $T_1$ and $T_2$, close to those of the living tissues by the use of any gelatin composition. Although a polyacrylamide gel having a water content ranging from 70 to 85% may be prepared, such a gel has an exceedingly high $T_2$ value and is apt to lose uniform structure during the cross-linking polymerization (gelation) step. Agar or agarose has an exceedingly high $T_1$ value and a remarkably low $T_2$ value as compared with those of the living tissues.

Other known materials include bean-curd, carrageenan, alginic acid, boiled egg, poly(2-hydroxyethyl methacrylate) gel, Curdlan, carboxymethyl cellulose (CMC), acrylonitrile-starch graft gel (see E. B. Bagley et al., "Ind. Eng. Chem. Prod. Res. Dev.", 14 105 (1975)), xanthane gum, Locust Bean Gum, tragacanth gum, furcellaran, methyl cellulose, casein, albumin, fucoidin, triethanolamine alginate, tamarind gum, karaya gum, gatti gum and jam (such as pectin gel). However, properties of all of these known materials cannot be brought to be equivalent to the water content and $T_1$ and $T_2$ values of the living tissues.

KONNYAKU has an excessively high water content and considerably high $T_1$ and $T_2$ values Although poly(N-vinylpyrrolidone) has an adequate water content, it is too high in $T_1$ and $T_2$ values. Even if an adjusting agent, such as nickel, manganese, copper or graphite, is added to poly(N-vinylpyrrolidone), both of $T_1$ and $T_2$ values thereof cannot be brought to the values equivalent to those of living tissues.

A gel having an adequate water content (ranging within 70 to 85 wt %) may be prepared by exposing an aqueous solution of polyvinyl alcohol to gamma-ray. However, the $T_1$ and $T_2$ values of the thus prepared gel are lowered as the results of exposure to gamma-ray.

Because of the fact that any of the known materials (chemical substances) have many demerits, as described above, a fresh tissue of an animal has been used reluctantly as the control material in practice. However, such an animal-originated material is deteriorated significantly with the lapse of time even when stored in a cold place, as reported by R. V. Damadian, U. S. Pat. No. 3,789,832 (1974), and significant differences are found between the samples extracted from individual animals of the same species. Under such circumstances, it should be reasonable and well-grounded to accept the opinion, in which it has been repeatedly pointed out that it is necessary to find out a water-containing material (for phantom) which is not originated from a living body (in other words, a chemical substance) and repeatedly usable for a long time while having substantially equivalent NMR informations ($\rho$, $T_1$ and $T_2$) and being improved in shape-retaining property and satisfactory moldability.

For use as a phantom for NMR diagnosis proposed is a hydrogel having a high water content and prepared by casting an aqueous solution containing more than 8 wt % and not more than 50 wt % of polyvinyl alcohol having a degree of hydrolysis of not less than 98 mol % and an average polymerization degree of not less than 1,000 into a mold, followed by freezing and thawing of the thus cast mass. The phantom proposed previously has an advantage that it has a water content and $T_1$ and $T_2$ values resembling those of soft living tissues, and it can be used as a material satisfying the aforementioned requirements.

However, the hydrogel having a high water content, as described in the preceding paragraph, is applied for use while being contained in a sealed container made of a plastic material in order to prevent air-drying of the hydrogel. When the hydrogel is used for the inspection of discrimination ability of the system on the samples having different NMR characteristics, plural gel masses which are differentiated in water content (or differentiated in relaxation time by the addition of an agent for shortening the relaxation time) are prepared and placed side by side, and then the image of the boundary region between these gel masses is observed. However, the walls of the sealed containers for respective hydrogel masses appear as dark or black lines in the image. This problem may be avoided by placing the bare hydrogel masses directly side by side and then contained in a sealed container. However, it is inevitable that a gap is left at the boundary region which is imaged as a dark or black line. In addition, water or the agent for shortening the relaxation time tends to migrate through the boundary region (interlaminar transportation). It has been tried to pack hydrogel samples having different NMR characteristics individually in separate containers made of thin plastic films. However, gaps are left at the boundary regions between the adjacent packed hydrogels, and there is another problem that bubbles are formed in the packed hydrogel masses. Although formation of bubbles may be obviated by the use of vacuum packing technique, respective hydrogel masses must be packed in containers which are made of hard and thick plastic films in order that the packed masses retain their shapes and dimensions to avoid gaps formed between the adjacent packed hydrogel masses. Accordingly, the problem of appearance of dark or black lines due to walls of the containers cannot be solved by separate packing of different hydrogel masses.

SUMMARY OF THE INVENTION

An object of this invention is to provide a method of making a phantom used for diagnosis by nuclear magnetic resonance (NMR) imaging, the phantom being not originated from a living body and made of plural hydrogels each having NMR characteristics ($\rho$, $T_1$ and $T_2$) substantially equivalent to and resembling those of a living tissue.

Another object of this invention is to provide a method of making a phantom for NMR diagnosis containing plural high water content hydrogel masses placed adjacent to each other through a thin film which is not imaged in the NMR imaging step without the formation of bubbles or gaps.

These and other objects of the invention will become apparent from the following description.

A method of making a phantom for NMR diagnosis, according to the present invention, comprises the steps of placing at least one small container having at least a portion of its wall made of a thin film of a plastic material in a large container made of a plastic material, charging a first aqueous solution of polyvinyl alcohol into the small container, charging a second aqueous solution of polyvinyl alcohol into a space defined by the outer wall of the small container and the inner wall of the large container, a composition of the first aqueous solution of polyvinyl alcohol being different from a composition of the second aqueous solution of polyvinyl alcohol, freezing the first and second aqueous solutions of polyvinyl alcohol to obtain frozen masses, and then thawing the frozen masses.

DESCRIPTION OF THE INVENTION

Figure 1:
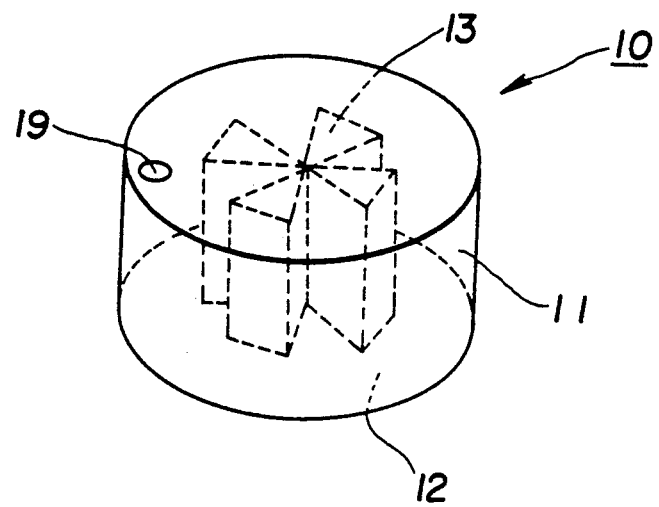
FIG. 1 is a perspective view showing an example of a phantom for NMR diagnosis prepared in accordance with the method of this invention.

The present invention will now be described in detail.

According to the method of this invention, a phantom for NMR diagnosis is made by a high water content hydrogel of polyvinyl alcohol having a first composition and contained in at least one small container having at least a portion of its wall made of a thin film of a plastic material and a high water content hydrogel of polyvinyl alcohol having a second composition different from that of the first mentioned high water content hydrogel and contained in a large container made of a plastic material, the small container being placed in the large container. Two or more small containers each having at least a portion of its wall made of a thin film of a plastic material may be placed in the large container. A third or subsequent aqueous solution or solutions of polyvinyl alcohol each having a different composition from those of the first and second aqueous solutions may be contained in each of the two or more small containers to form the phantom for NMR diagnosis of the present invention. It is preferred that both of the small and large containers be sealingly closed by lids after the hydrogels are charged therein.

According to an important aspect of this invention, at least a portion of the wall of the small container is made of a thin film of a plastic material. The plastic material forming at least a portion of the wall of the small container may be a transparent or opaque material which is water-impermeable and which does not affect the magnetic field applied for the NMR analysis. For example, noise signal or other inconvenient influence should not be induced by the plastic material forming the wall of the small container. Examples of the plastic material forming the thin wall of the small container are polyvinylidene chloride, polyamides, polyvinyl chloride, polyesters, silicone rubbers, natural rubbers, poly(isoprene-isobutyrene) rubbers, polysulfone, polycarbonate, acrylic resins and nitrile rubber. A small container having at least a portion of its wall made of a thin film of the plastic material of the aforementioned nature may be prepared by fixing a piece of a thin film onto a side wall, bottom or top face of the small container by using an adhesive or by fusing. When fusing technique is used, polyethylene or polypropylene may be used as the materials for the small container and for the thin film. However, when the thin film is fixed by using an adhesive, a combination of the material for the small container and the material for the thin film should be selected from a wide variety of known plastic materials in consideration of the adhesiveness. In order that the image of the thin film does not appear in the NMR imaging, it is preferred that the thickness of the thin film be not more than 20 microns, more preferably not more than 10 microns.

In the method of this invention, at least one small container is placed and preferably fixed in a large container. The general contour of the large container may have a shape simulating a head or body portion of a human body to be placed in a static magnetic field, or a shape of a cylinder having a diameter of from 15 to 45 cm. Similarly to the small container and the thin film fixed thereon, the large container may be made of a material selected from the known plastic materials. Examples of the materials which may be used for forming the large container are acrylic resins, polyvinyl chloride resins, polyethylene, polypropylene, polyamides, polystyrene, celluloid, cellulose acetate, rubber chloride, phenolic resins, urea resins, melamine resins, fluorinated resins, polycarbonate, polyacetal resins, polyalkyleneoxide, alkyd resins, furan resins, unsaturated polyester resins, epoxy resins, polyurethane resins and silicon resins.

According to this invention, an aqueous solution of polyvinyl alcohol is charged in the small container, and another aqueous solution of polyvinyl alcohol is charged in a space defined by the outer wall of the small container and the inner wall of the large container. The polyvinyl alcohol which is used for forming the hydrogel may have a degree of hydrolysis of not less than 98 mol % and an average polymerization degree of not less than 1,000.

In the method of this invention, an aqueous solution containing polyvinyl alcohol is prepared. It is preferred that the concentration of polyvinyl alcohol in the aqueous solution be more than 8 wt % and not more than 50 wt %, preferably within the range of 70 to 80 wt %, to obtain a hydrogel having NMR properties equivalent to those of living tissues.

According to an important aspect of this invention, the first aqueous solution of polyvinyl alcohol charged in the small container has a composition which is different from that of the second aqueous solution of polyvinyl alcohol which is charged in the space surrounded by the outer wall of the small container and the inner wall of the large container. The composition of the first aqueous solution may be differentiated from that of the second aqueous solution by varying the water content by 1 to 2 percents. Otherwise, an appropriate amount of an agent for shortening the relaxation time may be added to at least one of the first and second aqueous solution to differentiate the properties of the hydrogel contained in the small container from those of the hydrogel contained in the space defined by the outer wall of the small container and the inner wall of the large container. Such agents for shortening the relaxation time have been well known in the art, the specific examples being gadolinium diethylenetriamine pentaacetate (D. H. Carr et al., "Lancet", March 3, 484 (1984)), $Mn^{2+}$ (G. Laukien et al., "Z. Phisik.", 146, 113 (1956)), $Ni^{2+}$ (R. Hausser, "Arch. Sci. (Geneva)", 11, 252 (1958)), $Cu^{2+}$ (R. Hausser et al., "Z. Physik.", 182, 93 (1964)), $Fe^{2+}$, $Fe^{3+}$ (J. C. Gore et al., "Phys. Med. Biol.", 29, 1189 (1984)), glycerin, ethyl alcohol, isopropyl alcohol, agar, carrageenan, glucose and graphite.

In the method of this invention, after charging the aqueous solutions of polyvinyl alcohol having different compositions in the small container or containers and in the space defined by the outer wall of the small container or containers and the inner wall of the large container, the aqueous solutions are cooled to a temperature of not higher than −(minus) 10° C. to obtain frozen masses, which are then thawed to prepare a phantom comprised of high water content hydrogels having different properties. The freezing and thawing steps may be repeated to improve the modulus of elasticity of each hydrogel. The NMR properties of the hydrogels contained in the small container or containers and in the large container are differentiated by the different compositions of the aqueous solutions of polyvinyl alcohol.

Other ingredients or additives, which do not hinder gelation of polyvinyl alcohol, may be present in at least one of the aqueous solutions within the scope of this invention. The amount of one or more coexisting additives may be controlled, for example, in the range of not more than one half in weight of the weight of the polyvinyl alcohol contained in the aqueous solution. Examples of the additives which do not hinder gelation of polyvinyl alcohol are sodium chloride and those which are used as the agents for adjusting the NMR properties ($T_1$, $T_2$) including the agents for shortening the relaxation time as referred to above. One or more of these additives may be directly, or in the form of an aqueous solution or suspension, added to at least one of the aqueous solutions of polyvinyl alcohol under agitation so as to be dispersed uniformly therein, and then the aqueous solution or dispersion may be subjected to the subsequent freezing and other treating steps.

According to the present invention, the water contents of hydrogels may be properly varied to be agreed with the water contents of various living tissues. The water content of a certain hydrogel depends on the preparation or composition of the aqueous solution or suspension of polyvinyl alcohol used in the initial step. The water content of a hydrogel which is prepared by simple freezing and thawing (or subjecting to repeated freezing and thawing cycles) may be easily calculated, since the aqueous solution or suspension used at the initial step has been gelled.

Accordingly, a phantom prepared by the method of this invention has a predetermined water content set to simulate the water content of the specific living tissue, such as skin (Water Content: 51 to 69%), ureter (Water Content: 58%), Lig. nuchae (Water Content: 58%), Achilles tendon (Water Content: 63%), tongue (Water Content: 60 to 68%), prostate (Water Content: 69 to 76%), lens (Water Content: 67 to 70%), liver (Water Content: 70 to 77%), stomach (Water Content: 80%), pancreas (Water Content: 75%), small intestine (Water Content: 80%), skeletal muscles (Water Content: 79 to 80%), uterus (Water Content: 80%), thymus (Water Content: 82%), bladder (Water content: 82%) and kidney (Water Content: 78 to 81%). The phantoms prepared by the method of this invention are characterized by the fact that they have the $T_1$ and $T_2$ values substantially agreeing with those of the simulated living tissues.

For the inspection of performance characteristics of an NMR system covering the water content range of living tissues, a phantom having at least one small container, preferably plural small containers, arranged in the large container is used. Prior to the inspection step, the electric and magnetic systems or circuits are thoroughly adjusted until uniform density of the entire image region is attained (until uniformity in intensity of the image signal is attained) while placing a model of human body composed of hydrogel prepared by freezing and thawing polyvinyl alcohol having a certain composition in the static magnetic field of the NMR diagnosis system surrounded by the receiver coil for receiving radio-frequency wave.

A phantom prepared by the method of this invention is then placed in the NMR diagnosis system to check whether the differences in NMR characteristics of hydrogels are detected or not. For this purpose, an image of the boundary region between the gel contained in the small container and the gel surrounding the small container and contained in the large container is photographed. If the electric and magnetic circuits of the NMR diagnosis system have not been perfectly adjusted, the discrimination ability of the system for discriminating the difference in water content between the gel contained in the small container and that of the gel surrounding the small container becomes poor and 1 percent difference in water content cannot be discriminated by observing the photographed image. The imperfect adjustment of the NMR diagnosis system can be checked by differentiating the $T_1$ or $T_2$ value of the gel contained in the small container from that of the gel surrounding the small container by about 5%.

The phantom prepared by the method of this invention has a water content which may be varied within a wide range of from 50 to 92 wt % to cover the water contents of various living tissues which vary from 58 to 61% of the skin and Lig. nuchae to 78 to 82% for the liver and bladder.

The phantom prepared by the method of this invention has $T_1$ and $T_2$ values substantially agreed with those of a living tissue, and thus satisfy the requirements concerning the NMR informations (water content, $T_1$ and $T_2$) for forming a model equivalent to a living tissue.

A phantom prepared by the method of this invention includes plural gels having different NMR characteristics and positioned side by side. Accordingly, the discrimination ability of an NMR diagnosis system for discriminating differences in NMR characteristics can be checked by the use of the phantom prepared by this invention.

Since no thick wall material is interposed between the adjacent gels having different NMR characteristics in the phantom prepared by the method of this invention, the image of the boundary region does not contain an image of the interposing wall material and it is possible to appraise precisely the ability of a certain NMR diagnosis system for imaging the boundary region.

A phantom prepared by the method of this invention comprises plural gels having different NMR characteristics and a thin film having a thickness of preferably not more than 20 microns and interposed between adjacent gels. The thin film is not imaged in the NMR imaging and migration or interlaminar transportation of water or an agent for shortening the relaxation time is blocked by the thin film.

A phantom prepared by the method of this invention comprises a solid material, i.e. a rubber-like gel which is not easily collapsed and which is improved in shape retaining property, contained in a container having at least a portion of its wall made of a thin film which is not sensed by NMR imaging. Accordingly, the phantom prepared by the method of this invention is free from deformation of thin film wall by the lapse of time, otherwise observed when a water-soluble or fluidized gel is used, and also free from peeling-off of the thin film or leakage of water due to inferior adhesion.

EXAMPLES OF THE INVENTION

The present invention will now be described with reference to some Examples thereof. In the following Examples, "%" stands for "% by weight".

EXAMPLE 1

An image inspection phantom 10 shown in FIG. 1 was prepared.

Figure 2:
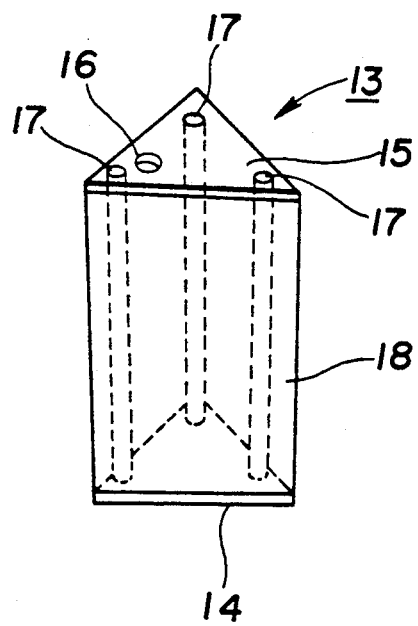
FIG. 2 is a perspective view showing an example of a small container used in the method of this invention.

In a cylinder (large container) 11 having a diameter of 180 mm and a height of 166 mm and made of an acrylic resin, contained were four prism-shaped containers (small containers) 13 each having a bottom plate 14 (see FIG. 2) made of an acrylic resin. The four small containers were arranged as shown in FIG. 1 and the bottoms 14 thereof were fixed to the bottom 12 of the large container using an adhesive. Each of the small containers 13 had a top plate 15 of an acrylic resin, and a charge port 16 having a diameter of 20 mm was provided through the top plate 15. The top plate 15 was fixedly connected to the bottom plate 14 by three round rods 17 each having a diameter of 5 mm and made of an acrylic resin. The side walls of the small container 13 were made of polyvinylidene chloride films each having a thickness of 8 microns. Into the four small containers 13 were charged solutions of polyvinyl alcohol dissolved in isotonic sodium chloride solutions, respectively, having water contents of 79.5%, 79.0%, 78.5% and 78.0%. Into the space surrounding the four small containers 13 and defined by the inner wall of the large container 11 was charged a solution of the same polyvinyl alcohol dissolved in an isotonic sodium chloride solution and having a water content of 80.0%. The polyvinyl alcohol had an average polymerization degree of 1,100 and a degree of hydrolysis of 99.5 mol %. After closing the charge ports 16 of the small containers 13 and a charge port 19 of the large container 11, the contents in the small and large containers were frozen at −(minus) 30° C. and then thawed to prepare a phantom 10 comprising hydrogels having water contents of 79.55, 79.0%, 78.5% and 78.0% surrounded by a hydrogel having a water content of 80.0%. The water contents of these hydrogels correspond to the water contents (78 to 81%) of skeletal muscles, small intestine, stomach, uterus and kidney of a human body.

The thus prepared phantom 10 was placed in a static magnetic field (1.5T) of an NMR diagnosis system at a position where a body portion or head of a patient is to be placed, and the tomographical images thereof were photographed through the SR (Saturation Recovery) method (Repetition Time: $T_r = 2000$ ms), the IR (Inversion Recovery) method ($T_r = 2000$ ms, Delay Time = 300 ms) and the SE (Spin-echo) method ($T_r = 1000$ ms, Echo Time $T_E = 20$ ms). The result was that the contour of the large container II was precisely imaged and that the image of the gel having the water content of 80% had uniform brightness. The result revealed that the system had been already adjusted.

Not only the gel having the water content of 78.5% but also the gel having the water content of 79.0% were clearly imaged and easily discriminated both through the IR and SE methods ($T_r = 1000$ ms, $T_E = 20$ ms; and $T_r = 2000$ ms, $T_E = 40$ ms) to reveal that the NMR diagnosis system could detect 1.0 percent difference in water content. The contour of the gel having the water content of 79.5% and contained in the small container 13 having the trigonal section was not clearly imaged in that the sectional shape (triangle) was not discriminated although a slight change in brightness was observed at the center of the section. From the results described above, it was found that 1 percent difference in water content could be detected by the system but 0.5 percent difference in water content could not be detected thereby.

The relaxation times calculated from the experiments described above were $T_1 = 730$ ms and $T_2 = 89$ ms for the water content of 80.0%; $T_1 = 720$ ms and $T_2 = 85$ ms for the water content of 79.5%; $T_1 = 705$ ms and $T_2 = 81$ ms for the water content of 79.0%; and $T_1 = 685$ ms and $T_2 = 78$ ms for the water content of 78.5%. In view of the above, it was estimated that about 3% difference in $T_1$ and about 10% difference in $T_2$ could be discriminated by the system.

EXAMPLE 2

A similar phantom 10 as prepared in Example 1 was prepared except that 6 micron thick polycarbonate films were used to form the side walls of the small containers 13. Solutions of polyvinyl alcohol dissolved in isotonic sodium chloride solutions and respectively containing 0.02 mM, 0.05 mM, 0.1 mM and 0.2 mM of gadolinium were charged in each of he four small containers 13. A solution of the same polyvinyl alcohol dissolved in an isotonic sodium chloride solution and containing no gadolinium was charged in the space surrounding the four small containers 13 and defined by the large container 11. Gadolinium diethylenetriamine pentaacetate (Gd-DTPA) was used as a source of gadolinium, and the polyvinyl alcohol had an average polymerization degree of 1,500 and a degree of hydrolysis of 99.3 mol %. The concentrations of the polyvinyl alcohol in all of the solutions were 80.0 wt %. The charge ports 16 and 19 of the small and large containers were closed, and the contents in the containers were frozen at $-$(minus) 40° C. and then thawed to prepare a phantom 10 comprised of hydrogels each having a water content of 80%.

The thus prepared phantom 10 was placed in a static magnetic field (1.5T) of an NMR diagnosis system at a position where a body portion or head of a patient is to be placed, and the tomographical images thereof were photographed through the SR (Saturation Recovery) method, the IR (Inversion Recovery) method, and the SE (Spin-echo) method. In view of the result that the contour of the large container 11 was precisely imaged and that the image of the gel containing no gadolinium had uniform brightness, it was judged that the system had been already adjusted.

Figure 3:
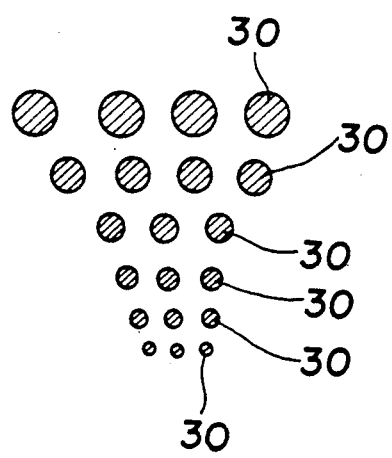
FIG. 3 is a sectional view showing rows of plural bars arranged in a container.

Separately, another phantom was prepared by charging an aqueous solution of the same polyvinyl alcohol having a water content of 80% in an acrylic resin container in which acrylic resin bars having diameters of 5 mm, 4 mm, 3 mm, 2 mm, 1 mm and 0.5 mm extended from the top plate to the bottom plate (the arrangement of the bars being shown in FIG. 3 in section), followed by freezing and thawing. The separately prepared phantom was placed in the system to check the operation condition of the system to find that the system was in good operation condition from the result that the bar having a diameter of 0.5 mm was clearly discriminated.

Then, using the phantom 10 prepared by the method of this invention, the system was checked through the IR method and the SE method to find that not only the gel containing 0.05 mM of Gd but also the gel containing 0.02 mM of Gd was clearly imaged and easily discriminated. From the result, it was confirmed that the NMR diagnosis system could detect 0.02 mM concentration of the added Gd. The relaxation times calculated from the experiments described above were $T_1 = 733$ ms and $T_2 = 89$ ms for 0 mM of Gd; $T_1 = 660$ ms for 0.02 mM of Gd; $T_1 = 590$ ms for 0.05 mM of Gd; and $T_1 = 460$ ms and $T_2 = 78$ ms for 0.1 mM of Gd. In view of the above, it was estimated that at least 10% difference in $T_1$ and at least 14% difference in $T_2$ could be discriminated by the system.

Although the present invention has been described with reference to the specific examples, it should be understood that various modifications and variations can be easily made by those skilled in the art without departing from the spirit of the invention. Accordingly, the foregoing disclosure should be interpreted as illustrative only and not to be interpreted in a limiting sense. The present invention is limited only by the scope of the following claims.

What is claimed is:

1. A method of making a phantom for NMR diagnosis comprising the steps of placing at least one small container having its wall made of a thin film of a plastic material having a thickness of not more than 20 microns in a large container made of a plastic material, charging a first aqueous solution of polyvinyl alcohol into said at least one small container, charging a second aqueous solution of polyvinyl alcohol into a space defined by the outer wall of said at least one small container and the inner wall of said large container, a composition of said first aqueous solution of polyvinyl alcohol being different from a composition of said second aqueous solution of polyvinyl alcohol, freezing said first and second aqueous solutions of polyvinyl alcohol to obtain frozen masses, and then thawing said frozen masses whereby the thin film constitutes a boundary that is not imaged during the making of an NMR image.

2. The method according to claim 1, wherein two or more small containers each having its wall made of a thin film of a plastic material having a thickness of not more than 20 microns are placed in said large container and wherein a third or subsequent aqueous solution or solutions of polyvinyl alcohol each having a different composition from those of said first and second aqueous solutions of polyvinyl alcohol are charged in each of said two or more small containers.

3. The method according to claim 1, wherein said large container has a diameter of from 15 to 45 cm.

4. The method according to claims 1 or 2, wherein said polyvinyl alcohol has a degree of hydrolysis of not less than 98 mol % and a polymerization degree of not less than 1,000.

5. The method according to claims 1 or 2, wherein each of said aqueous solutions contains said polyvinyl alcohol in a concentration of more than 8 wt % and not more than 50 wt %.

6. The method according to claim 1, wherein the water content of said first aqueous solution is different from the water content of said second aqueous solution.

7. The method according to claim 2, wherein the water content of said third and subsequent aqueous solutions is different from the water content of the first and second aqueous solutions.

8. The method according to claim 1, wherein the water content of said first aqueous solution is substantially the same as the water content of said second aqueous solution, and wherein at least one of said first and second aqueous solutions contains an agent for shortening the relaxation time.

9. The method according to claim 2, wherein the water content of at least two of the first to third and subsequent aqueous solutions is substantially the same, and wherein at least one of said first to third and subsequent aqueous solutions contains an agent for shortening the relaxation time.

10. The method according to claims 8 or 9, wherein said agent for shortening the relaxation time is selected from the group consisting of gadolinium diethylenetriamine pentaacetate, $Mn^{2+}$, $Ni^{2+}$, $Cu^{2+}$, $Fe^{2+}$, $Fe^{3+}$, glycerin, ethyl alcohol, isopropyl alcohol, agar, carrageenan, glucose, graphite and mixtures thereof.

11. The method according to claims 1 or 2, wherein said aqueous solutions of polyvinyl alcohol are cooled to a temperature of not higher than minus 10° C. to obtain said frozen masses.

12. The method according to claims 1 or 2, wherein the freezing and thawing steps are repeated.

13. The method according to claims 1 or 2, wherein at least one of said aqueous solutions contains an additional ingredient which does not hinder gelation of said polyvinyl alcohol.

14. The method according to claim 13, wherein said additional ingredient is selected from the group consisting of sodium chloride, an agent for shortening the relaxation time and mixtures thereof.

15. The method according to claim 14, wherein said agent for shortening the relaxation time is selected from the group consisting of gadolinium diethylenetriamine pentaacetate, $Mn^{2+}$, $Ni^{2+}$, $Cu^{2+}$, $Fe^{2+}$, $Fe^{3+}$, glycerin, ethyl alcohol, isopropyl alcohol, agar, carrageenan, glucose, graphite and mixtures thereof.

16. The method according to claims 1 or 2, wherein each of said aqueous solutions contains 50 to 92 wt % water.

17. The method according to claims 1 or 2, wherein said small and large containers are made of a material which is water-impermeable and which does not affect the magnetic field applied for NMR analysis.

* * * * *